(12) United States Patent
Baldi et al.

(10) Patent No.: US 6,399,442 B1
(45) Date of Patent: *Jun. 4, 2002

(54) METHOD OF MANUFACTURING AN INTEGRATED SEMICONDUCTOR DEVICE HAVING A NONVOLATILE FLOATING GATE MEMORY, AND RELATED INTEGRATED DEVICE

(75) Inventors: Livio Baldi, Agrate Brianza; Alfonso Maurelli, Sulbiate, both of (IT)

(73) Assignee: STMicroelectronics S.r.l., Agrate Brianza (IT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/415,021

(22) Filed: Oct. 7, 1999

(30) Foreign Application Priority Data

Oct. 9, 1998 (EP) .............................................. 98830595

(51) Int. Cl.⁷ .......................................... H01L 21/8247
(52) U.S. Cl. ...................................................... 438/258
(58) Field of Search ......................... 438/258, 257–267

(56) References Cited

U.S. PATENT DOCUMENTS 5,789,294 A      8/1998   Choi ........................... 438/258
5,824,583 A  *  10/1998   Asano et al. ................ 438/258
6,004,847 A  *  12/1999   Clementi et al.

FOREIGN PATENT DOCUMENTS

| EP | 0 379 449 A1 | 7/1990 |
| EP | 0 592 039 A2 | 4/1994 |
| JP | 63073566 | 4/1988 |
| JP | 03194967 | 8/1991 |
| JP | 06310733 | 11/1994 |

* cited by examiner

Primary Examiner—Richard Booth
(74) Attorney, Agent, or Firm—Lisa K. Jorgenson; E. Russell Tarleton; SEED IP Law Group PLLC

(57) ABSTRACT

A method of manufacturing an integrated semiconductor device having at least one non-volatile floating gate memory cell and at least one logic transistor. The method includes growing a first gate oxide layer over a silicon substrate, depositing a first polysilicon layer over the first gate oxide layer, selectively etching and removing the first polysilicon layer in order to define the floating gate of the memory cell, introducing dopant in order to obtain source and drain regions of the memory cell, depositing a dielectric layer, selectively etching and removing the dielectric layer and the first polysilicon layer in a region wherein the logic transistor will be formed, depositing a second polysilicon layer, selectively etching and removing the second polysilicon layer in order to define the gate of the logic transistor and the control gate of the memory cell. Between selectively etching the dielectric and depositing a second polysilicon layer, a first sub-step of removing the first gate oxide layer in the region for the logic transistor, and a second sub-step of growing a second oxide gate layer over the region, the second gate oxide layer having a different thickness than the first gate oxide layer.

9 Claims, 2 Drawing Sheets

METHOD OF MANUFACTURING AN INTEGRATED SEMICONDUCTOR DEVICE HAVING A NONVOLATILE FLOATING GATE MEMORY, AND RELATED INTEGRATED DEVICE

TECHNICAL FIELD

The present invention relates to a method of manufacturing an integrated semiconductor device comprising a nonvolatile floating gate memory and to the related integrated device. In particular, such a method will be integrable in logic processes of advanced generations.

BACKGROUND OF THE INVENTION

Due to the increasing complexity of integrated circuits, e.g., based on microcontrollers or DSP, it becomes necessary to use more and more complex programs, usually stored in a ROM (Read Only Memory) of the final device, and subject to variations during the development steps.

On the other side, the increase of the number of metal levels in the integrated circuits increases the cycle time for manufacturing the ROM memories with new contents, so that it is desirable to have an electrically programmable memory for storing programs during the product development steps.

Such a memory can be also used in the production version, both in case that some program releases have to be supported, and when the volumes are not excessive, if the added costs of the programmable memory are not excessive.

One of the possible solutions is the use of a Static RAM (SRAM) or a Dynamic RAM (DRAM), wherein the code is loaded from an external EPROM (Electrically Programmable Read Only Memory). Such a solution has the drawback of taking up a large silicon area, of requiring in all cases an external memory, of involving a high dissipation (in case of DRAM), and of requiring an extensive re-planning for the production version.

A possible different solution is the use of a conventional EPROM with two polysilicon levels, transformable then in a ROM in the production version. This solution is very efficient but requires a costly dedicated manufacturing process. Moreover, the manufacture of the EPROM can modify the logic process features.

A third solution is described in U.S. Pat. No. 5,395,778 in name of Philips, wherein an OTP (One Time Programmable) memory based on the same programming mechanism of EPROMs is used, but it is cheaper. This solution seems optimal for 0.5 $\mu$m processes.

The utilization of a low cost OTP memory as described in U.S. Pat. No. 5,395,778 is based on some essential features: the memory cell oxide is the same oxide used also for the logic circuitry; the process steps dedicated for manufacturing high voltage transistors are not present.

However, these features cause problems when it is desired to transfer this memory architecture to more advanced CMOS processes. Particularly, the gate oxide thickness continues to decrease with the subsequent process generations. For example, there is a passage from 0.5 $\mu$m process generations with gate oxide thickness of 10–12 nm to 0.25 $\mu$m process generations with thickness of 4–5 nm to 0.15 $\mu$m process generations with gate oxide thickness of 2–3 nm.

However, there is a critical limit for the gate oxide thickness that can be used in a nonvolatile memory, due to the tunnel effect directed through the gate oxide, that makes it difficult to keep the charge stored in the floating gate. This limit occurs at a gate oxide thickness of about 5 nm.

A further problem present in U.S. Pat. No. 5,395,778 is connected to the programming voltage management. In fact, the voltages necessary for programming do not scale down as does the process generation. Thus, during the programming step, it is necessary to operate with voltages higher than that usually utilized in the circuit. Also in this case the problems increase passing to more advanced CMOS generations. For example, while the 12 nm oxide, used for the 0.5 $\mu$m generation, can support for short periods a voltage of 10 V necessary for programming step, the 7 nm oxide, required by 0.35 $\mu$m processes, can support only a maximum voltage value of about 5.5 V. For controlling the programming voltages that in this particular generation decrease up to 8.0–8.5 V, complex circuit configurations have to be used. The problem is more critical for 0.25 $\mu$m processes, wherein the difference between the maximum voltage supportable by the gate oxide (3.5 V) and the programming voltage (7–8 V) is greater.

The architecture proposed in U.S. Pat. No. 5,395,778 is incompatible with an extension to advanced CMOS processes.

SUMMARY OF THE INVENTION

In view of the state of the art described, the invention provides a method of manufacturing a low cost OTP memory.

According to the present invention, a method of manufacturing an integrated semiconductor device comprising at least one non-volatile floating gate memory cell and at least one logic transistor is provided. The method comprises a first step of growing a first gate oxide layer over a silicon substrate, a second step of depositing a first polysilicon layer over said first gate oxide layer, a third step of selectively etching and removing said first polysilicon layer in order to define the floating gate of said memory cell, a fourth step of introducing dopant in order to obtain source and drain regions of said memory cell, a fifth step of depositing a dielectric layer, a sixth step of selectively etching and removing said dielectric layer and said first polysilicon layer in a region wherein said logic transistor will be formed, a seventh step of depositing a second polysilicon layer, an eighth step of selectively etching and removing said second polysilicon layer in order to define the gate of said logic transistor and the control gate of said memory cell. Between said sixth step and said seventh step there is a first sub-step of removing said first gate oxide layer in said region for said logic transistor, a second sub-step of growing a second oxide gate layer over said region, said second gate oxide layer being different from said first gate oxide layer.

BRIEF DESCRIPTION OF THE DRAWINGS

The features and advantages of the present invention will be made more evident by the following detailed description of two embodiments thereof, illustrated as non-limiting examples in the annexed drawings, wherein.

DETAILED DESCRIPTION OF THE INVENTION

The present invention provides a non-volatile floating gate memory cell which is compatible with the advanced generation CMOS processes while keeping the manufacturing simplicity of earlier processes. Particularly, the invention is useful for manufacturing OTP memories, which can be integrated in circuits based on microcontrollers or DSP.

FIGS. 1 to 6 show the process of manufacturing, in a CMOS environment, a logic circuitry transistor 10 and a memory cell 20, comprising a floating gate transistor, in a same integrated circuit, according to one embodiment of the present invention.

Figure 1:
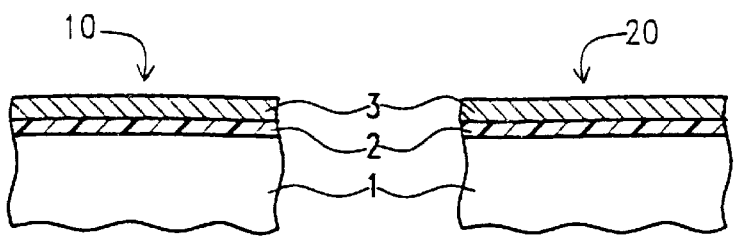
FIGS. 1 to 6 schematically show intermediate steps of a method of manufacturing a memory cell and a logic circuitry transistor according to a first embodiment of the present invention.

After the definition of wells and insulating field oxide regions (LOCOS, modified LOCOS or trench), the CMOS process flow provides for growing a first gate oxide layer 2 over a silicon substrate 1 for both transistors 10 and 20, and the gate oxide layer can be constituted by the same oxide used for possible high voltage transistors present in the integrated circuit, as shown afterwards. For example, considering a 0.5 μm process generation, the thickness of such gate oxide layer 2 is about 10 nm, but it can be reduced to 6–7 nm for more advanced generations. Subsequently, a first polysilicon layer 3 is deposited (FIG. 1).

At this point a step of selective etching and removal of the first polysilicon layer 3 on the memory cell 20 is provided by means of a photolithographic mask 4, in order to define the floating gate 31 of the memory cell 20. The region assigned to the logic circuitry transistor 10 is completely covered by the mask 4.

Figure 2:
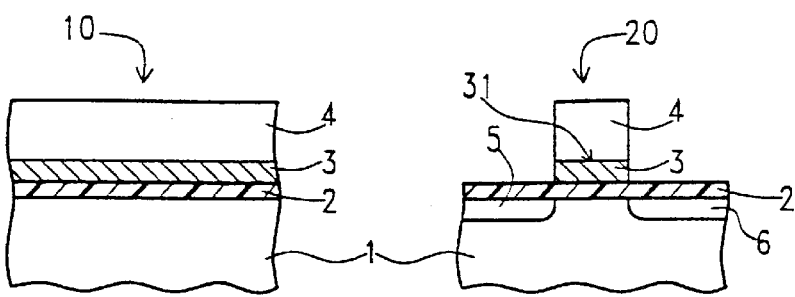

Using the same mask 4, a ion source and drain implantation of the memory cells 20 is accomplished, with the further possibility of applying a high angle boron implantation in order to increase the threshold voltages of the memory cells, although it is possible that this implant is not necessary for advanced generation processes due to the higher doping of substrate. The source 5 and drain 6 regions of the memory cell 20 are then obtained (FIG. 2).

Figure 3:
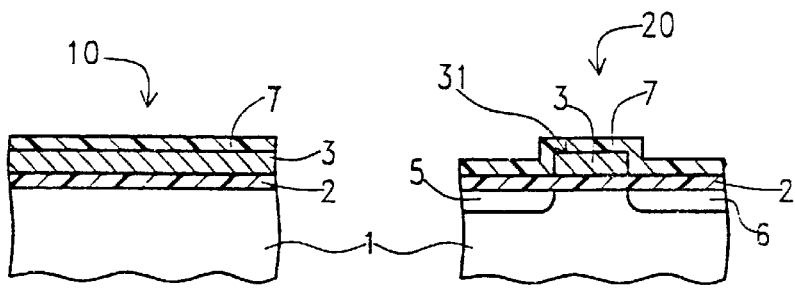

After the mask 4 removal, the formation of an intermediate dielectric layer 7 is provided, preferably constituted by an ONO (Oxide-Nitride-Oxide) multilayer, obtained at low temperature by means of a combination of short oxidations and CVD depositions of nitride and silicon oxide (FIG. 3).

Figure 4:
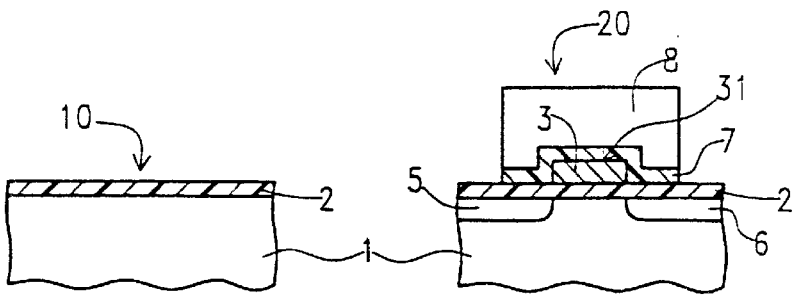

In the subsequent step a selective etching and removal of the intermediate dielectric layer 7 from the logic circuitry 10 are accomplished, leaving it on the floating gate 31 of the memory cell 20 by means of a second mask 8. The etching removes also the first polysilicon layer 3 and stops on the first gate oxide layer 2 previously grown (FIG. 4).

Alternatively to that shown in the figure, it may not be necessary to remove the intermediate dielectric layer 7 at the floating gate 31 sides of the memory cell 20, because it is however removed in a subsequent step of defining oxide spacers.

Figure 5:
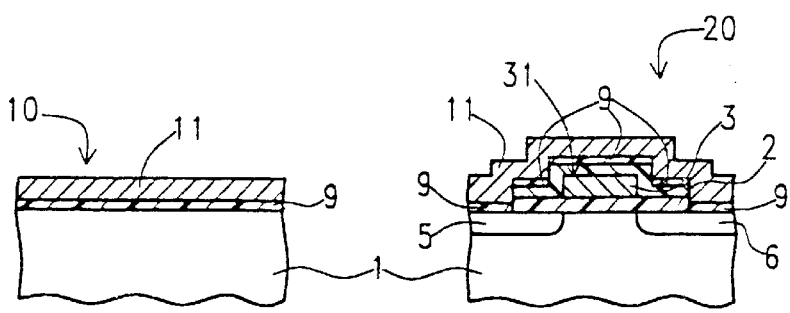

At this point the first gate oxide layer 2 is removed, using the same mask 8, preferably by means of a wet etching for not damaging the underlying silicon substrate 1 surface. After the mask 8 removal, proper washings are accomplished and then a second gate oxide layer 9 of the logic circuitry transistor 10 is grown, having a thickness independent from the first gate oxide layer 2 and according to the process requirements. This process step does not change appreciably the thickness of the intermediate dielectric layer 7, but helps its densification. A second polysilicon layer 11 is then deposited, which can be doped with suitable masks according to the logic process requirements (FIG. 5).

Figure 6:
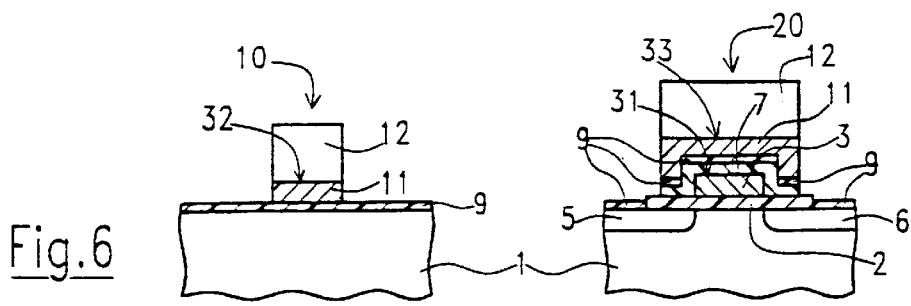

Subsequently a selective etching of the second polysilicon layer 11 is provided by means of a third mask 12 in order to define the gate 32 of the logic circuitry transistor 10 and the control gate 33 of the memory cell 20. The etching is stopped on the second gate oxide layer 9 or, in the case that the intermediate dielectric layer 7 of the memory cell 20 has not been previously removed, on the gate oxide layer 9 superimposed to it. The mask 12 is defined so that the second polysilicon layer 11, corresponding to the control gate 33, completely covers the first polysilicon layer 3, corresponding to the floating gate 31 (FIG. 6).

The process continues then with the typical flow of a CMOS process, with the formation of lightly doped drain regions, of oxide spacers, of more doped drain junctions, and with the definition of salicide.

In the process flow proposed, the oxide layer 2 of the memory cell 20 is independent of the oxide layer 9 of the logic circuitry 10. Thus, the process can be transferred to advanced generation CMOS processes. It is possible to obtain logic circuitry transistors having a very thin gate oxide without the memory cells causing problems of poor charge keeping, having thicker gate oxide thicknesses.

In a second embodiment the process flow follows the same steps as above described, up to the deposition of the first polysilicon layer 3. In this case it is convenient to have a first polysilicon layer 3 thickness slightly higher, preferably of about 150–200 nm, in order to facilitate the subsequent contact manufacture.

Figure 7:
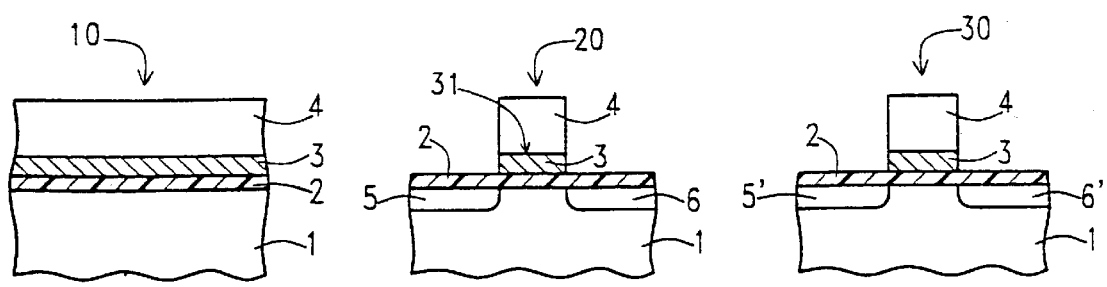
FIGS. 7 and 8 show two intermediate steps of a process of manufacturing a memory cell, a logic circuitry transistor, and a high voltage transistor, according to a second embodiment of the present invention.

With reference to FIG. 7 (to be compared to FIG. 2), wherein a memory cell 20, a logic circuitry transistor 10 and a high voltage transistor 30 are present, the mask 4 for defining the first polysilicon layer 3 defines also the lower polysilicon layer of the high voltage transistors 30. In case of an N channel high voltage transistor, the source 5' and drain 6' regions are advantageously obtained by means of the same implant that forms the source 5 and drain 6 regions of the memory cell 20.

A step of depositing the intermediate dielectric layer 7 and of removing it from the logic circuitry transistor 10, together with the first polysilicon layer 3, follows. On the contrary, the high voltage transistor 30 must be protected by the same mask protecting the memory cell 20. The subsequent steps provide for removing the first gate oxide layer 2, still using the previous mask, preferably by means of a wet etching. After removing the mask, a second gate oxide layer 9 of the logic circuitry transistor 10 is grown, having a thickness independent from the first gate oxide layer 2 present in the memory cell 20 and in the high voltage transistor 30. A second polysilicon layer 11 is then deposited.

Figure 8:
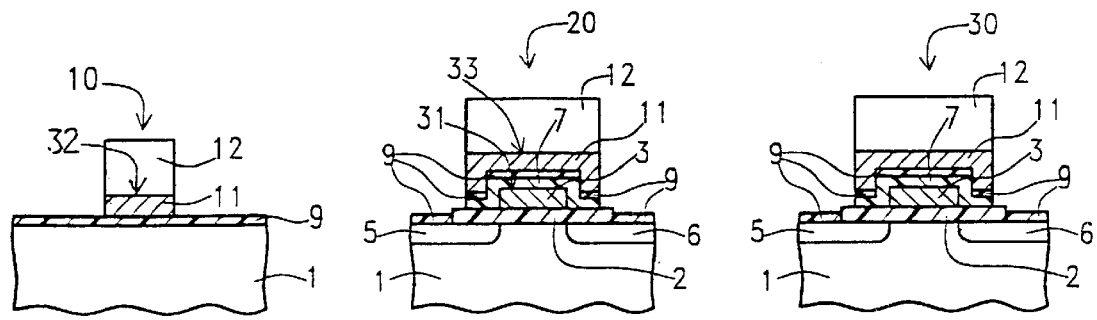
Figure 9:
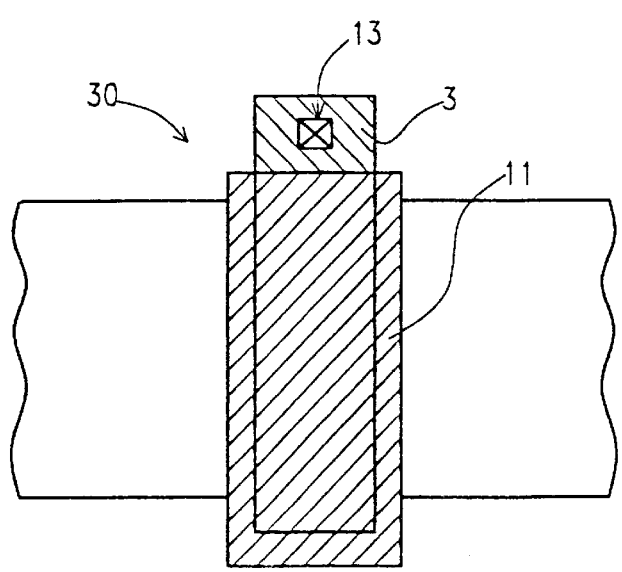
FIG. 9 shows a plan view of a high voltage transistor, according to the second embodiment of the present invention.

Subsequently, the definition of the second polysilicon layer 11 is provided, as shown in FIG. 8 (to be compared to FIG. 6); The mask 12 protects the high voltage transistor 30, as well as the memory cell 20, from the selective etching. The second polysilicon layer 11 covers the first polysilicon layer 3, except in an area of the field oxide wherein a gate contact 13 will be later formed (FIG. 9).

In this way there is no risk of forming polysilicon residuals around the first polysilicon layer 3 and in the transistor source and drain regions. Moreover, in this configuration the source and drain doping of the N channel high voltage transistor 30 is the same doping of the memory cell 20, and it can be controlled in an independent way from that of the logic circuitry transistor 10. An alternative configuration can provide for the complete removal of the second polysilicon layer 11 from the high voltage transistor 30, and in such a case it is possible to obtain also P channel high voltage transistors (or N channel) using the same source and drain doping of the logic circuitry transistors 10.

According to this second embodiment it is then possible to obtain high voltage transistors not scaled, with the same gate oxide as that of the memory cell, also in advanced CMOS processes, with a reduced process complexity. For example, in the case that a gate oxide thickness of about 10 nm is used for the memory cells and for the high voltage transistors, such a thickness enables programming of the memory cells with maximum gate voltages of about 8 V, which can be managed directly, for the short periods required for programming, by high voltage transistors having the same oxide thickness, without applying to complex circuit solutions.

Obviously it is possible to improve the features both of the high voltage transistors and of the memory cells, in the case that one or more ion implantation masks, having a relatively reduced cost, are added, for example, for regulating the threshold voltage of the high voltage transistors in an independent way compared with that of the memory cells, or doping in a different way the source and drain regions of the high voltage transistors compared with the memory cells.

What is claimed is:

1. A method of manufacturing an integrated semiconductor device having at least one non-volatile floating gate memory cell and at least one logic transistor, the method comprising in sequence: a first step of growing a first gate oxide layer over a silicon substrate, a second step of depositing a first polysilicon layer over said first gate oxide layer, a third step of selectively etching and removing said first polysilicon layer in order to define the floating gate of said memory cell, a fourth step of introducing dopant in order to obtain source and drain regions of said memory cell, a fifth step of depositing a dielectric layer, a sixth step of selectively etching and removing said dielectric layer and said first polysilicon layer in a region wherein said logic transistor will be formed, a seventh step of depositing a second polysilicon layer, an eighth step of selectively etching and removing said second polysilicon layer in order to define the gate of said logic transistor and the control gate of said memory cell, and further comprising between said sixth step and said seventh step a first sub-step of removing said first gate oxide layer in said region for said logic transistor, and a second sub-step of growing a second gate oxide layer over said region, said second gate oxide layer having a different thickness than a thickness of said first gate oxide layer.

2. The method of claim 1 wherein during said sixth step said dielectric layer is etched and removed at the sides of said memory cell.

3. The method of claim 1 wherein said second gate oxide layer has a thickness lower than the thickness of said first gate oxide layer.

4. The method of claim 1, further comprising providing for manufacturing at least one high voltage transistor comprising source and drain regions in said silicon substrate, a gate oxide constituted by said first gate oxide layer and a lower gate constituted by said first polysilicon layer.

5. The method of claim 4 wherein said high voltage transistor comprises an intermediate dielectric layer located over said lower gate and constituted by said dielectric layer.

6. The method of claim 5 wherein said high voltage transistor comprises an upper gate, located over said intermediate dielectric layer and constituted by said second polysilicon layer.

7. A method of manufacturing an integrated circuit, comprising:
    forming a first gate oxide on a silicon substrate;
    defining a floating gate in a memory cell region and a high voltage transistor region on the silicon substrate;
    forming source and drain regions in the silicon substrate in the memory cell region and the high voltage transistor region; and
    forming a gate in a logic transistor region and control gates on the floating gates in the memory cell and high voltage transistor regions, including removing the first gate oxide in the logic transistor region and growing a second gate oxide layer of a thickness different than the first gate oxide layer over the logic transistor, memory cell, and high voltage transistor regions.

8. The method of claim 7 wherein growing the second gate oxide layer comprises growing the second gate oxide layer to a thickness that is thinner than the thickness of the first gate oxide layer.

9. The method of claim 7 wherein forming the control gate comprises forming a polysilicon layer over a dielectric layer in the memory cell and high voltage transistor regions.

* * * * *